United States Patent [19]
Zhang

[11] Patent Number: 5,867,024
[45] Date of Patent: Feb. 2, 1999

[54] RF-SQUID WITH AN INTEGRATED LAMBDA-MICROWAVE RESONATOR USEFUL AS HIGHLY SENSITIVE MAGNETOMETER

[75] Inventor: Yi Zhang, Jülich, Germany

[73] Assignee: Forschungszentrum Julich GmbH, Julich, Germany

[21] Appl. No.: 569,219
[22] PCT Filed: Jun. 15, 1994
[86] PCT No.: PCT/DE94/00671
   § 371 Date: Dec. 15, 1995
   § 102(e) Date: Dec. 15, 1995
[87] PCT Pub. No.: WO94/29739
   PCT Pub. Date: Dec. 22, 1994

[30] Foreign Application Priority Data

Jun. 16, 1993 [DE] Germany .................. 43 19 693.4

[51] Int. Cl.$^6$ ............. G01R 33/035; H01P 7/00
[52] U.S. Cl. ............ 324/248; 505/846; 505/160; 327/527
[58] Field of Search ............ 324/244, 248, 324/260; 327/527; 505/845, 846, 160, 162

[56] References Cited

U.S. PATENT DOCUMENTS

| | | | |
|---|---|---|---|
| 4,168,441 | 9/1979 | McDonald et al. | 327/527 |
| 4,403,189 | 9/1983 | Simmonds | 324/248 |
| 5,065,096 | 11/1991 | Muck et al. | 324/248 |
| 5,420,100 | 5/1995 | Vittoria et al. | 505/162 |
| 5,465,049 | 11/1995 | Matsuura et al. | 324/248 |

OTHER PUBLICATIONS

Kornev et al. "Microwave–Frequency SQUID with a High–Q Dielectric Resonator" Radio Engineering & Eletronic Physics vol. 25, No. 12 Dec. 1980 pp. 122–128.

*Primary Examiner*—Walter E. Snow
*Attorney, Agent, or Firm*—Herbert Dubno

[57] ABSTRACT

An RF-SQUID magnetometer whose RF-SQUID has an operating frequency, is formed by a superconductive ring having a Josephson element. An electric resonant circuit in the form of a closed superconductive conductor is coupled with the ring and forms a superconductive microwave resonator at that frequency.

6 Claims, 3 Drawing Sheets

RF-SQUID WITH AN INTEGRATED LAMBDA-MICROWAVE RESONATOR USEFUL AS HIGHLY SENSITIVE MAGNETOMETER

CROSS REFERENCE TO RELATED APPLICATIONS

This application is a national phase of PCT/DE94/00671 filed 15 Jun. 1994 and based, in turn, upon German national application P 43 19 693.4 filed 16 Jun. 1993 under the International Convention.

FIELD OF THE INVENTION

The invention relates to an rf-SQUID comprised of a superconductive ring formed with a Josephson element and including a superconductive microwave resonator coupled therewith and forming an electric resonant circuit.

BACKGROUND OF THE INVENTION

A SQUID is a sensor for measurement of magnetic flux. A SQUID is coupled with a flux transformer in the performance of measurement of a magnetic field, the flux transformer converting the magnetic field into a flux. A conventional flux transformer is comprised of a so-called pick-up coil for field-flux conversion and a coupling coil for further conduction of the flux to the SQUID. Such a construction is referred to as a SQUID magnetometer. A measure of the functional capability of a SQUID magnetometer is the field sensitivity. To operate a rf-SQUID-magnetometer, the latter is generally coupled to an electric resonant circuit, also called a tank circuit, into which a high-frequency current is fed at the resonance frequency of the tank circuit. The SQUID damps the tank circuit with a degree of damping dependent upon the magnetic flux through the superconductive ring. As a result there is a change in the voltage drop across the tank circuit which is used as a read-out for the SQUID.

From EP 04 18 848 A2, a $LT_c$-RF-SQUID with an integrated microwave resonator is known. In this case the superconductive ring as well as the tank circuit are formed in one component. The tank circuit is comprised of a strip conductor. The electrical length of the strip conductor corresponds to a half microwave $\lambda$ of the operating frequency and thus forms a $\lambda/2$ microwave resonator. The strip resonator is capacitatively connected to the evaluation electronics.

To reliably set the resonator characteristics, the SQUID is arranged symmetrically relative to the strip conductor. This symmetry further allows the SQUID to be at a location of maximum current flux which ensures a sufficiently good coupling between resonator and SQUID. One such construction is fabricated from high temperature superconductive materials in accordance with Appl. Phys. Lett. 60(18), p. 2303, 1992.

SUMMARY OF THE INVENTION

It is an object of the invention to provide an rf-SQUID magnetometer with improved field sensitivity and which can be fabricated from high temperature superconductive material.

This object is achieved with an rf-SQUID comprised of a superconductive ring having a Josephson element and with an electric resonant circuit coupled with the ring and forming a superconductive microwave resonator wherein the microwave resonator is formed as a closed superconductive conductor. The closed conductors can have optionally formed geometry. For example, the closed conductor can be realized in a ring-like or oval form. The structure is fabricatable from a single high-temperature superconductive layer. The SQUID ring and closed conductor can thus be formed from strip conductors.

Because of the closed conductor, this system for the first time provides a $\lambda$ resonator instead of $\lambda/2$ resonator. Such a resonator has not been used heretofore since it was not possible with the required closed conductor to effect the presumably required symmetrical coupling of the SQUID to the resonator.

The closed conductor in the present system functions however not only as a resonator but also as a pick-up coil. In comparison to the construction with the $\lambda/2$ resonator, the collection of the magnetic flux is significantly increased.

For the operation of the SQUID, the resonance frequency is supplied in known manner by a capacitive coupling which forms standing waves in the resonator. The standing waves can by initially selecting an optional length of the resonator develop as a result of testing or adjusting a resonance frequency. If one must operate at a given frequency, then the resonator should be so formed that its electrical length corresponds to the wavelength or to a multiple of the wavelength of the operating frequency. It is know that the SQUID should be arranged advantageously at a location of maximum current flux.

Because of the integration of the pick-up coil, the optimum operating conditions $K^2 \cdot Q \approx 1$ (K=coupling, Q=quality factor of the resonator) are achieved while the coupling between resonator and SQUID because of the asymmetry is poorer. In total, there is a significantly increased field sensitivity of the SQUID magnetometer.

Advantageously, the Josephson element is located outside the closed conductor path. This is achieved by providing two branches from the closed conductor path ends whose ends are so brought together that these form the Josephson element. The field sensitivity is further increased in this way.

Advantageously the closed conductor is formed as a ring. In this manner the enclosed area and thus the collected magnetic flux are maximized.

Advantageously the SQUID and the conductor both are formed from a $Yba_2Cu_3O_{7-x}$ layer.

BRIEF DESCRIPTION OF THE DRAWING

In the Figures, the SQUID with integrated $\lambda$ microwave resonator is shown schematically and described further below. In the drawings.

SPECIFIC DESCRIPTION

Figure 1:
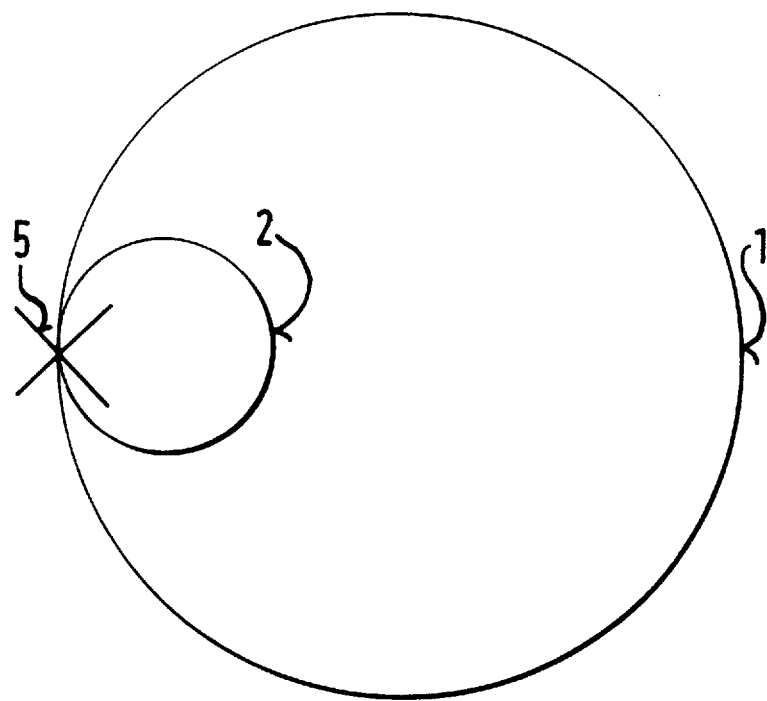
FIG. 1 is a schematic illustration of the closed conductor with SQUID.

In FIG. 1 the closed conductor 1 is formed as a ring. An RF-SQUID 2 is coupled to it. The Josephson element 5 of the SQUID 2 is integrated into the conductor 1.

Figure 2:
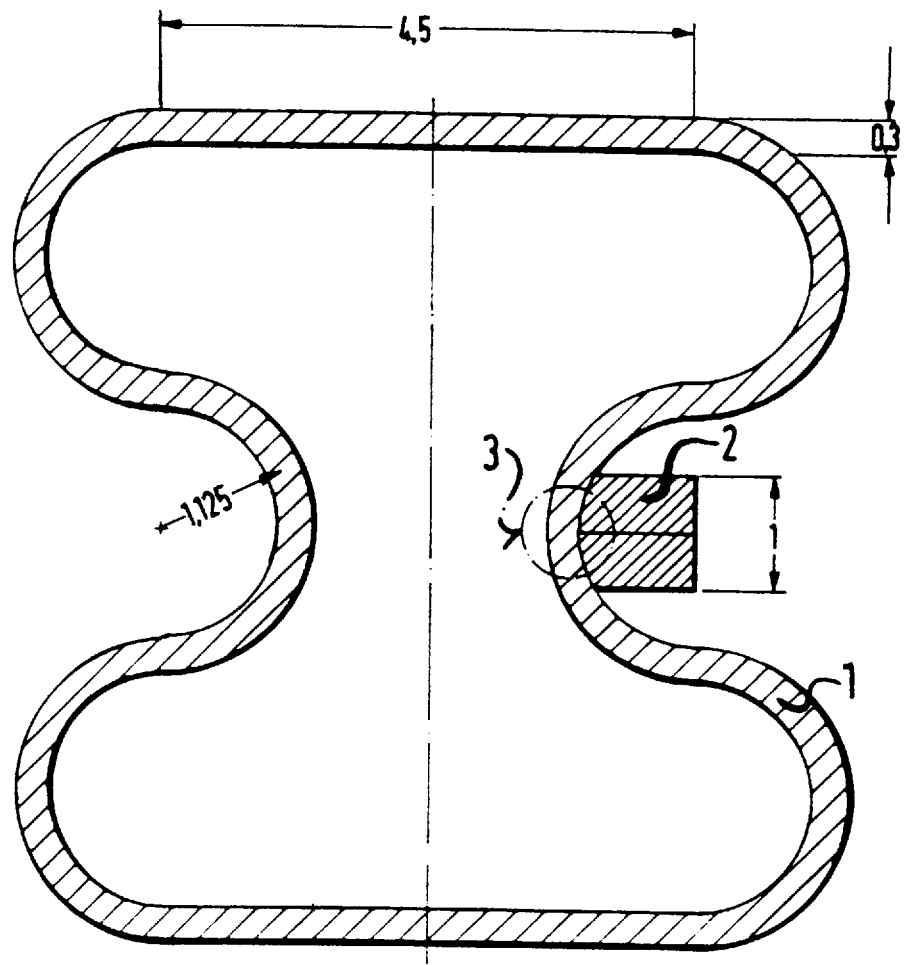
FIG. 2 is a diagram of a closed conductor formed from a layer with a SQUID coupled thereto.

The SQUID shown in FIG. 2 with integrated $\lambda$ microwave resonator, is comprised of a closed conductor, formed with a strip conductor 1 as well as a SQUID 2 coupling thereto. The closed conductor is formed with inward bulges, one of which contains the SQUID 2.

In FIG. 2, lengths are given in mm. The so dimensioned resonator has a resonance frequency of 3 Ghz. The capacitative coupling is effected at a quarter of the conductor although removed from the coupling of the SQUID thereto, i.e. on a straight section of the conductor. As a result, the SQUID is found at a location of maximum current flux.

Figure 3:
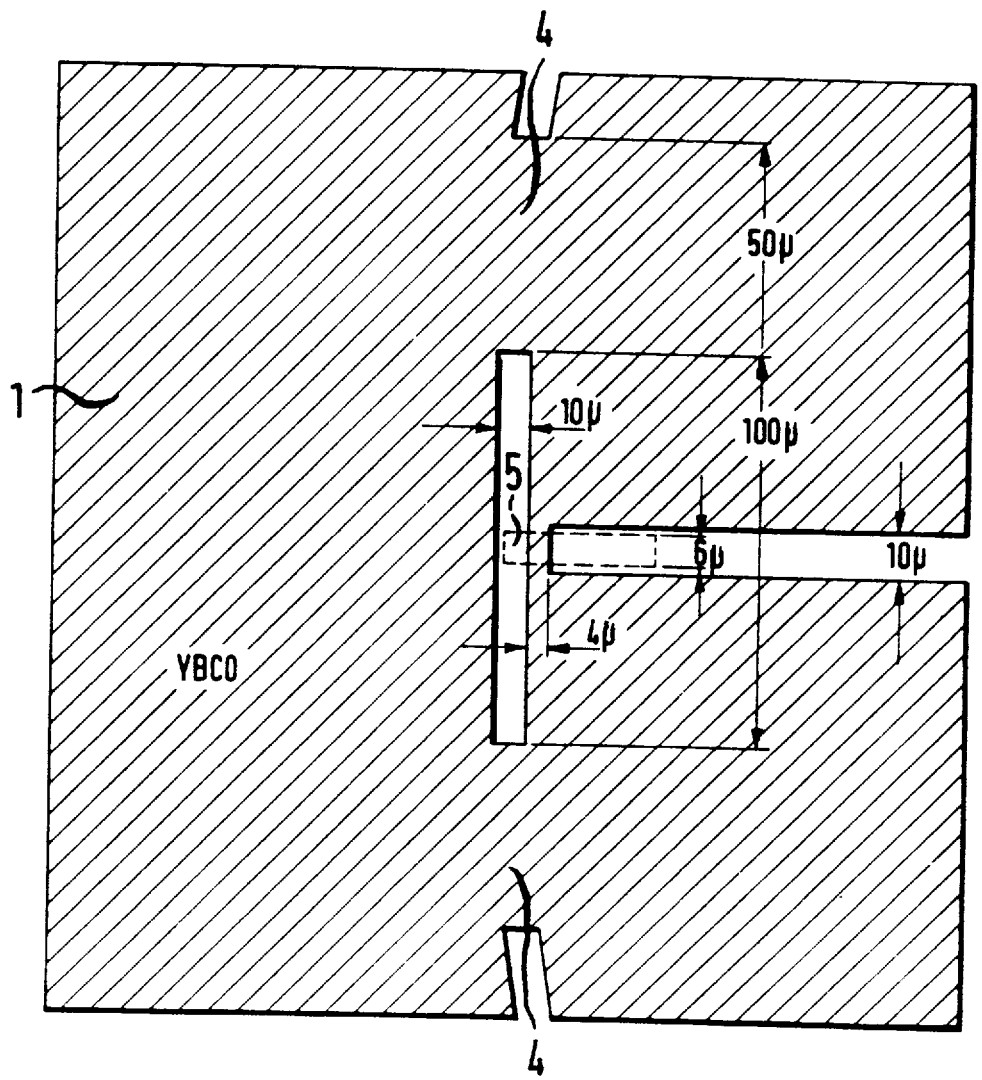
FIG. 3 is a cross sectional view showing the coupling of the SQUID to the conductor in an enlarged view.

FIG. 3 presents an enlarged section of the coupling location of FIG. 2. This section is marked in FIG. 2 by the circle 3. From the conductor 1 two conductors 4 are branched. The ends of the both branched conductors 4 form a Josephson element 5. The thus resulting ring having the Josephson element 5 with SQUID 2, whereby the Josephson element is located outside the conductor 1.

It has been found that the SQUID magnetometer shown in FIG. 2 and fabricated from $YBA_2Cu_3O_{7-x}$ has four times greater sensitivity than an optimized $\lambda/2$ microwave SQUID magnetometer. By geometric alterations, the magnetometer can be improved and the field sensitivity further increased.

I claim:

1. An RF-SQUID magnetometer comprising:

an RF-SQUID having an operating frequency and formed by a superconductive ring having a Josephson element; and an electric resonant circuit coupled with the ring and forming a superconductive microwave $\lambda$ resonator at said frequency, the microwave resonator being formed as a closed superconductive conductor, said Josephson element being disposed outside the closed conductor, the closed conductor being configured as a ring.

2. The RF-SQUID magnetometer defined in claim 1 wherein said RF-SQUID and said conductor are fabricated from a $YBa_2Cu_3O_{7-x}$ layer.

3. An RF-SQUID magnetometer comprising:

an RF-SQUID having an operating frequency and formed by a superconductive ring having a Josephson element; and an electric resonant circuit coupled with the ring and forming a superconductive microwave $\lambda$ resonator at said frequency, the microwave resonator being formed as a closed superconductive conductor, the closed conductor being configured as a ring.

4. An RF-SQUID magnetometer comprising:

an RF-SQUID having an operating frequency and formed by a superconductive ring having a Josephson element; and an electric resonant circuit coupled with the ring and forming a superconductive microwave $\lambda$ resonator at said frequency, the microwave resonator being formed as a closed superconductive conductor, said RF-SQUID and said conductor being fabricated from a $YBa_2Cu_3O_{7-x}$ layer.

5. An RD-SQUID magnetometer comprising:

an RF-SQUID having an operating frequency and formed by a superconductive ring having a Josephson element; and an electric resonant circuit coupled with the ring and forming a full-wave superconductive microwave $\lambda$ resonator at said frequency, the microwave resonator being formed as a closed superconductive conductor in the form of another ring, said Josephson element being disposed outside said other ring, the SQUID and the other ring being formed in a $Yba_2Cu_3O_{7-x}$ superconductive layer.

6. An RF-SQUID magnetometer comprising:

an RF-SQUID having an operating frequency and formed by a superconductive ring having a Josephson element; and an electric resonant circuit coupled with the ring and forming a superconductive microwave $\lambda$ resonator at said frequency, the microwave resonator being formed as a closed superconductive conductor and said Josephson element being disposed outside the closed conductor.

* * * * *